(12) United States Patent
Sanchez et al.

(10) Patent No.: US 9,299,560 B2
(45) Date of Patent: Mar. 29, 2016

(54) METHODS FOR DEPOSITING GROUP III-V LAYERS ON SUBSTRATES

(71) Applicant: APPLIED MATERIALS, INC., Santa Clara, CA (US)

(72) Inventors: Errol Antonio C. Sanchez, Tracy, CA (US); Yi-Chiau Huang, Fremont, CA (US); Xinyu Bao, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 106 days.

(21) Appl. No.: 13/736,504

(22) Filed: Jan. 8, 2013

(65) Prior Publication Data

US 2013/0183815 A1 Jul. 18, 2013

Related U.S. Application Data

(60) Provisional application No. 61/586,184, filed on Jan. 13, 2012.

(51) Int. Cl.
*H01L 21/02* (2006.01)
*H01L 21/285* (2006.01)
*H01L 21/3065* (2006.01)

(52) U.S. Cl.
CPC ...... *H01L 21/0254* (2013.01); *H01L 21/02636* (2013.01); *H01L 21/28525* (2013.01); *H01L 21/28556* (2013.01); *H01L 21/3065* (2013.01)

(58) Field of Classification Search
None
See application file for complete search history.

(56) References Cited

U.S. PATENT DOCUMENTS

| 6,064,078 | A | 5/2000 | Northrup et al. |
| 7,078,318 | B2 | 7/2006 | Jürgensen et al. |
| 8,084,371 | B2 | 12/2011 | Seo et al. |
| 2008/0017891 | A1 | 1/2008 | Datta et al. |
| 2010/0163931 | A1 | 7/2010 | Fujioka et al. |
| 2011/0104875 | A1 | 5/2011 | Wojtczak et al. |

OTHER PUBLICATIONS

Takuya Hoshii, et al., "Epitaxial Lateral Overgrowth of InGaAs on SiO₂ from (111) Si Micro Channel Areas", Phys. Stat. Sol. (c), 5, No. 9, pp. 2733-2735.
International Search Report and Written Opinion mailed Apr. 29, 2013 for PCT Application No. PCT/US2013/020804.

*Primary Examiner* — Stanetta Isaac
(74) *Attorney, Agent, or Firm* — Moser Taboada; Alan Taboada

(57) ABSTRACT

Methods for depositing a group III-V layer on a substrate are disclosed herein. In some embodiments a method includes depositing a first layer comprising at least one of a first Group III element or a first Group V element on a silicon-containing surface oriented in a <111> direction at a first temperature ranging from about 300 to about 400 degrees Celsius; and depositing a second layer comprising second Group III element and a second Group V element atop the first layer at a second temperature ranging from about 300 to about 600 degrees Celsius.

18 Claims, 4 Drawing Sheets

METHODS FOR DEPOSITING GROUP III-V LAYERS ON SUBSTRATES

CROSS-REFERENCE TO RELATED APPLICATIONS

This application claims benefit of U.S. provisional patent application Ser. No. 61/586,184, filed Jan. 13, 2012, which is herein incorporated by reference.

FIELD

Embodiments of the present invention generally relate to methods for depositing layers on substrates, and more specifically, to methods for depositing layers comprising Group III and Group V elements.

BACKGROUND

Group III-V materials may be advantageous in certain applications for silicon-based devices, for example, as source/drain materials or the like, due to low contact resistance and ability to function as a stressor for mobility enhancement in silicon-based devices. Unfortunately, the inventors have observed that processes for deposition of Group III-V materials on silicon (Si) substrates often results in poor material quality.

Accordingly, the inventors have provided improved methods of depositing Group III-V materials on silicon substrates.

SUMMARY

Methods for depositing a group III-V layer on a substrate are disclosed herein. In some embodiments a method includes depositing a first layer comprising at least one of a first Group III element or a first Group V element on a silicon-containing surface oriented in a <111> direction at a first temperature ranging from about 300 to about 400 degrees Celsius; and depositing a second layer comprising second Group III element and a second Group V element atop the first layer at a second temperature ranging from about 300 to about 600 degrees Celsius.

In some embodiments, a computer readable medium may be provided having instructions stored thereon that, when executed, cause a method of depositing a group III-V layer on a substrate to be performed in a process chamber. The method may include any of the methods as described herein.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
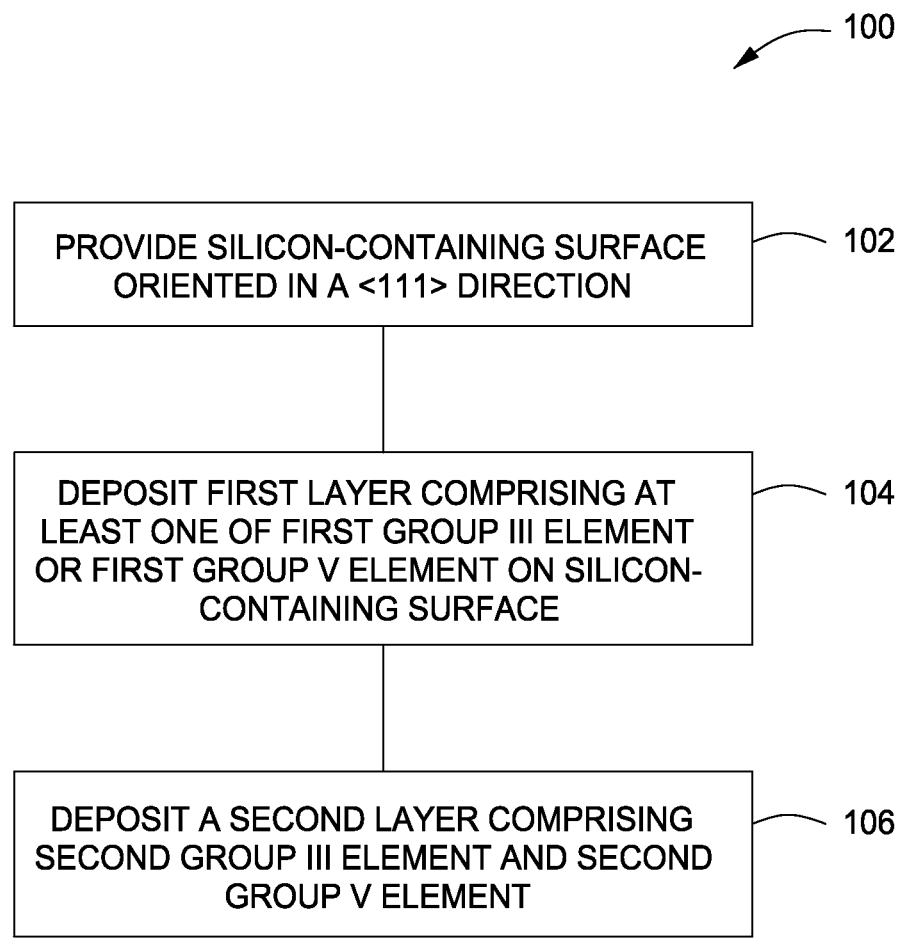
FIG. 1 depicts a flow chart of a method for depositing a Group III-V layer on a substrate in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods for depositing a group III-V layer on a substrate are disclosed herein. Embodiments of the inventive methods may advantageously allow for improved nucleation and material quality, for example, on surfaces that may have a lattice mismatch with the deposited group III-V layer (such as silicon-containing surfaces). The inventive methods may further advantageously allow for self-selective deposition or alternatively, etch-assisted selective deposition may be performed. Other and further advantages of the inventive methods are discussed below.

Figure 2A:
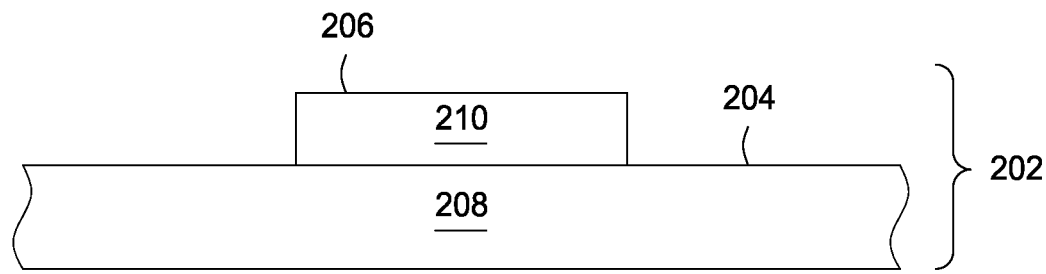
FIGS. 2A-G depicts the stages of fabrication of a Group III-V layer on a substrate in accordance with some embodiments of the present invention.

FIG. 1 depicts a flow chart for a method 100 of depositing a Group III-V layer on a substrate in accordance with some embodiments of the present invention. The method 100 is described below in accordance with stages of fabrication of a Group III-V layer on a substrate as illustrated in FIGS. 2A-G in accordance with some embodiments of the invention. As illustrated in FIG. 2A, a substrate 202 may include a first surface 204 and a second surface 206. In some embodiments, the first surface 204 may be a silicon-containing surface disposed in a silicon-containing substrate 208. For example, the silicon-containing substrate 208 may include germanium (Ge), carbon (C), boron (B), phosphorus (P) or other known elements that may be co-grown, doped, and/or associated with silicon materials.

In some embodiments, the second surface 206 may be part of a dielectric layer, such as a dielectric layer 210 disposed on the silicon-containing substrate 208. For example, the dielectric layer may comprise one or more of silicon nitride (SiN), silicon oxide ($SiO_2$), silicon oxynitride (SiON) or other suitable materials than may be used to form a dielectric layer. The embodiments of the substrate 202 as illustrated in FIG. 2A are merely exemplary and other suitable configurations of the substrate 202 are possible. For example, as illustrated in FIG. 2A, the substrate 202 may be part of a partially formed device, such as a planar metal-oxide-semiconductor field effects transistor (MOSFET). However, other devices, such as fin field effects transistors (FinFETs) or the like may be used with the inventive methods disclosed herein.

The method 100 generally begins at 102 by providing a silicon-containing surface oriented in a <111> direction. The silicon-containing surface, such as the first surface 204 may be already oriented in a <111> direction, such as illustrated in FIG. 2A. For example, a silicon-containing wafer, such as the silicon-containing substrate 208 may have been grown such that the first surface 204 is oriented in the <111> direction.

Figure 2B:
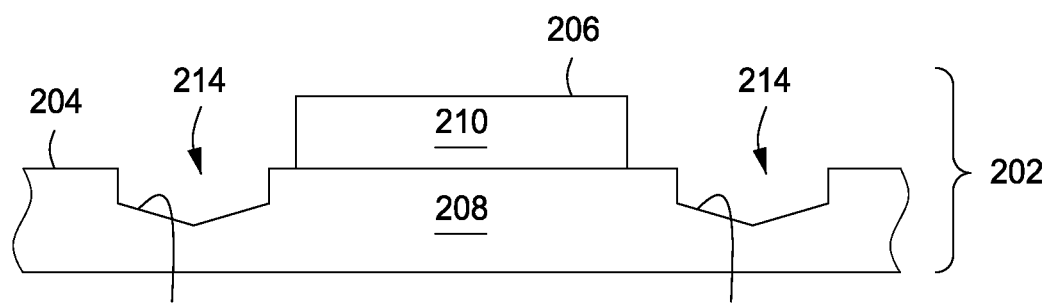
Figure 2C:
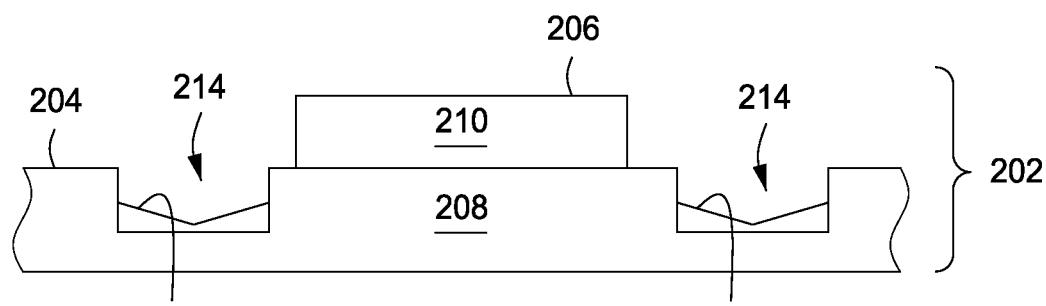

Alternatively, as illustrated in FIGS. 2B-C, a silicon-containing surface oriented in the <111> direction may be formed through etching and/or additional processes as discussed below. For example, as illustrated in FIG. 2B, in some embodiments, the first surface 204 may be oriented in a direction other than the <111> direction, and the silicon-containing substrate 208 may be etched until a silicon-containing surface 212 is reached. For example, as illustrated in FIG. 2B, the silicon-containing surface 212 may be part of a source/drain region 214 etched into the first surface 204 of the silicon-containing substrate 208 on both sides of the dielectric layer 210. Any suitable etch process may be utilized, such as wet or dry etch methods, plasma assisted etching methods or the like. For example, in some embodiments, a dry etch method such as a thermal chlorine ($Cl_2$) etch may be used. Typically, etch processes associated with the invention methods disclosed herein may be performed at temperatures of about 750 degrees Celsius or below, for example, in some embodiments, ranging from about 50 to about 500 degrees Celsius. The temperatures of the etch processes as specified above may be necessary in certain applications, for example, to prevent silicon reflow as the source/drain region 214 is etched.

As is natural of crystallographic planes, the silicon-containing surface 212 (e.g., a surface oriented in <111> direction) will form a specific angle relative to the known orientation of the first surface 204. Thus formation of the silicon-containing surface 212 may be verified by any suitable crystallographic analytical technique such as x-Ray diffraction, electron diffraction, or the like.

Alternatively, as illustrated in FIG. 2C, and instead of etching until the silicon-containing surface 212 oriented in the <111> direction has been reached, the silicon-containing substrate 208 having the first surface 204 oriented in a direction other than the <111> direction may be etched to form the source/drain region 214. For example, in FIG. 2C, the source/drain region 214 may not have a surface oriented in the <111> direction. However, a silicon-containing surface 216 oriented in the <111> direction may be grown in the source/drain region 214. The silicon-containing surface 216 may be grown by any suitable silicon growth technique, such as faceted silicon re-growth.

The method 100 continues below in accordance with the embodiments of the substrate 202 as illustrated in FIG. 2A, wherein the first surface 204 is a silicon-containing surface oriented in the <111> direction. However, the method 100 may also be utilized with the embodiments of the silicon-containing surfaces 212 or 216 as illustrated in FIGS. 2B-C respectively.

Figure 2D:
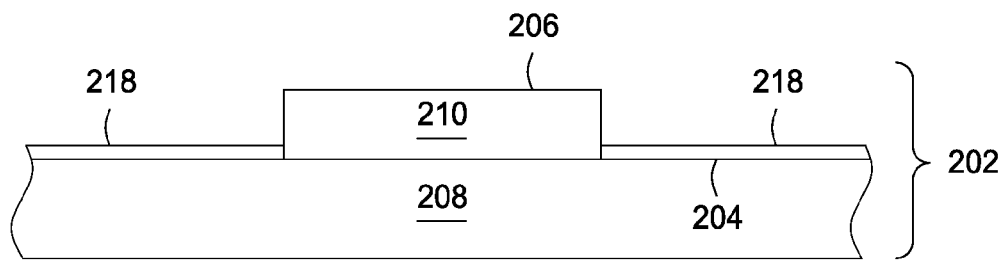

Next, at 104, a first layer 218 may be deposited on the silicon-containing surface 204, as illustrated in FIG. 2D. The first layer 218 may include at least one of a first Group III or a first Group V element. For example, the Group III or Group V element may be selected based on one or more factors such as the ability to attain good coverage of the silicon-containing surface 204 under the temperature and pressure conditions used, the electrical requirements of the device being manufactured, the composition of a second layer (e.g., a second layer 222 as discussed below) to follow the first layer 218, or other suitable factors. For example, the first Group III and the first Group V elements may be any suitable elements included in Group III and Group V respectively of the Periodic Table of Elements.

The first layer 218 may be deposited by any suitable deposition method, such as reduced pressure chemical vapor deposition (CVD) or any other suitable deposition method. For example, the first layer 218 may be deposited from one or more Group III or Group V source materials. Exemplary Group III and Group V source materials may include tertiary butyl phosphorus, tertiary butyl arsenic, triethyl antimony, trimethyl antimony, triethyl gallium, trimethyl gallium, triethyl indium, trimethyl indium, indium chloride, gallium chloride, trimethylaluminum or the like. For example, the one or more Group III or Group V source materials may be in any suitable state, such as a solid or liquid that may be sublimed or vaporized respectively, or in a gaseous state. For example, the source materials may be metal organic precursors or the like.

The first layer 218 may comprise one or several monolayers of at least one of the first Group III element or the first Group V element. For example, in some embodiments, only one of either the first Group III element or the first Group V element may be used. For example, the selection of either the first Group III or Group V elements may be based on criteria as discussed above. Alternatively, the first layer 218 may comprise alternating monolayers of the first Group III and Group V elements. For example, alternating monolayers may be utilized for example when neither the first Group III nor the first Group V elements provides a distinct advantage over the other based on criteria as discussed above, or to provide a better nucleation surface for a second layer (e.g., a second layer 222 as discussed below) to be disposed atop the first layer 218, or the like.

The first layer 218 may be deposited at a first temperature and first pressure. For example, the first temperature and the first pressure may be suitable to permit the selective deposition of the first layer 218 on the first surface 204 and not the second surface 206 of the dielectric layer 210. However, in some embodiments, for example, depending on deposition criteria, the identity of the first Group III or Group V elements, or the like, some deposition may occur on the second surface 206. In some embodiments, the first temperature may range from about 300 to about 400 degrees Celsius. In some embodiments, the first pressure may range from about 10 to about 200 Torr.

Figure 2E:
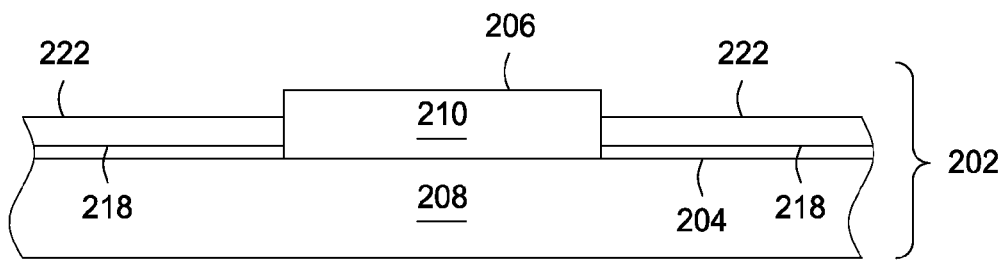

At 106, a second layer 222 comprising a second Group III element and a second Group V element may be deposited on the first layer 218, as illustrated in FIG. 2E. For example, the second Group III element may be the same or different from the first Group III element. Similarly, the second Group V element may be the same or different from the first Group V element. For example, differences may occur between the first and second elements such as when a particular first Group III or V element may be better for forming the first layer 218 based on criteria discussed above, but a particular second Group III or V element may be better suited for the device being formed, such as having better electron mobility, providing better channel strain, or the like. In some embodiments, the second layer 222 may comprise one of a binary or a ternary Group III-V material. When the second layer 222 is a ternary material, the second layer 222 may further comprise at least one of a third Group III element of a third Group V element. In some embodiments, the second layer 222 may comprises a Group III-V material comprising at least one of arsenides or phosphides.

The second layer 222 may be deposited using similar methods and source materials as discussed above for the first layer 218. The source materials may be co-flowed to deposit the second layer 222. For example, the second layer 222 may be deposited at a second temperature and a second pressure. Similar to the first temperature and the first pressure, the combination of the second temperature and the second pressure may provide selective deposition of the second layer 222 only on the first layer 218 disposed on the first surface 204 and not the second surface 206 of the dielectric layer 210 in some embodiments of the invention. For example, as discussed above for the first layer 218, the selective deposition of the second layer 222 using the first temperature and the first pressure may depend on the identity of the second layer 222, desired concentrations of the second Group III and V elements and optionally the third Group III or V elements, the desired quality and/or properties of the second layer 222, or the like. In some embodiments, the second temperature may range from about 300 to about 600 degrees Celsius. The second temperature may be suitable to grow the second layer 222 to be a low defect density single crystalline layer of the desired Group III-V material. In some embodiments, the second pressure may range from about 40 to about 400 Torr. The second layer 222 may be deposited using any desired composition and/or thickness, for example, such as to maximize benefits of contact resistance and/or stress induced mobility enhancement, or other suitable criteria as discussed above.

Figure 2F:
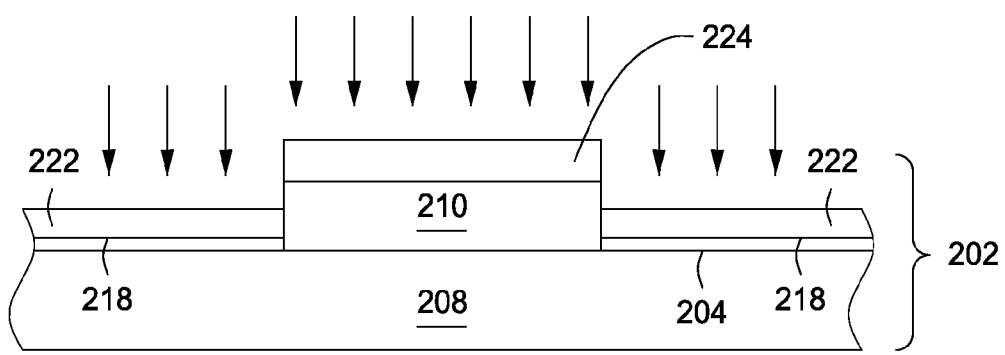
Figure 2G:
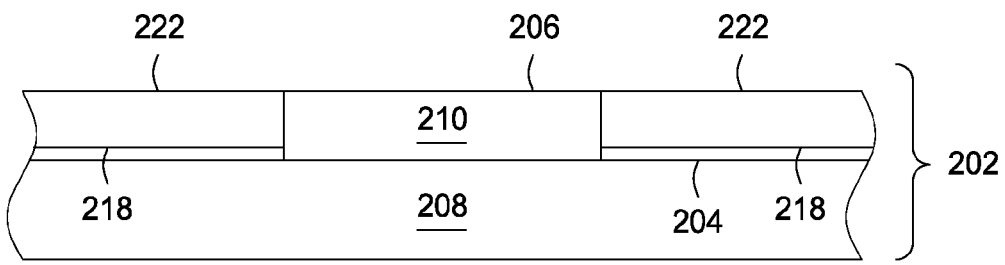

In some embodiments, for example, when self-selective deposition of the second layer 222 on only the first layer 218 disposed on the silicon-containing surface 204 is not possible, the second layer 222 may be etched to selectively remove a portion 224 of the second layer 222 that has deposited on the second surface 206 of the dielectric layer 210 as shown in FIG. 2F. For example, the deposition and etching of the second layer 222 may be performed simultaneously or alternated. For example, the second layer 222 may be etched using an etchant. The etchant 218 may comprise at least one or chlorine (Cl) or bromine (Br) and, optionally, hydrogen (H). For example, in some embodiments, the etchant may be at least one of hydrogen chloride (HCl), hydrogen bromide (HBr), chlorine ($Cl_2$), or bromine ($Br_2$).

For example, and by way of either self-selective deposition or the etch-assisted selective deposition of the second layer 222 as discussed above, FIG. 2G illustrates the second layer 222 grown to a desired thickness wherein the second layer 222 is not present on the second surface 206 of the dielectric layer 210.

Embodiments of the method 100, such as the silicon-containing surfaces 212 or 216 as illustrated in FIGS. 2B-C respectively and the deposition steps as 104 and 106 discussed below may be performed in the same or a series of process chambers. For example, in some embodiments, etching steps such as those used to form the silicon-containing surfaces 212 or 216 as illustrated in FIG. 2B-C respectively may be performed in a plasma etch chamber and then passed to one or more deposition chambers to perform deposition steps to form the surfaces 212 or 216 and/or first and second layers 218, 222. Optionally, between etching and deposition processes, the substrate 202 may be passed to cleaning apparatus, such as those apparatus configured for wet or dry cleaning processes. One suitable apparatus for practicing at least some aspects of the inventive methods is discussed below and illustrated in FIG. 3.

Figure 3:
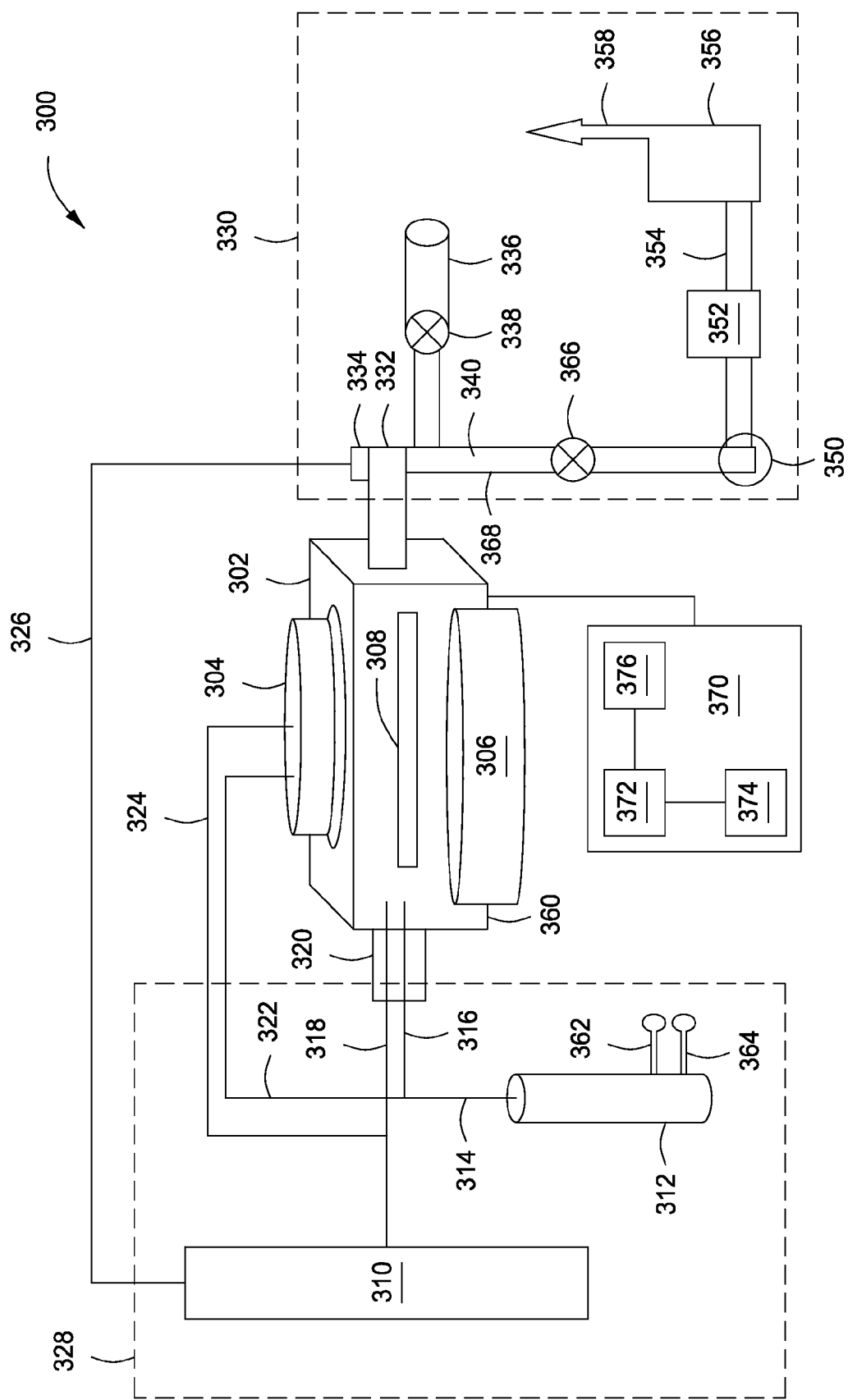
FIG. 3 depicts an apparatus for depositing a layer on a substrate in accordance with some embodiments of the present invention.

FIG. 3 is a schematic diagram of an apparatus 300 suitable for practicing the methods described herein for forming a Group III-V layer in accordance with embodiments of the present invention. An Epi™ 300 mm reactor or a 300 mm xGen™ chamber, both available from Applied Materials, Inc., of Santa Clara, Calif., may be adapted to make and use embodiments described herein. Other chambers from Applied Materials, Inc. or other manufacturers may also be modified in accordance with the teachings provided herein.

A processing chamber 302 has a substrate support 308, which may be a rotating substrate support, disposed in an interior thereof. A heat source 306 is disposed facing one side of the substrate support 308. Alternately, a heat source may be embedded in the substrate support 308. A chamber with a heated substrate support as described in commonly assigned U.S. Pat. No. 7,172,792, entitled "Method for forming a high quality low temperature silicon nitride film", issued Feb. 6, 2007, may be adapted to build the apparatus described herein and to practice the methods described herein. A chamber with a lamp heating module as described in commonly assigned U.S. Patent Publication 2008/0072820, entitled "Modular CVD Epi 300 mm Reactor", published Mar. 27, 2008, may also be adapted to build the apparatus described herein and to practice the methods described herein. The processing chamber 302 may have a showerhead 304 for gas entry into the chamber. Alternately, or in combination, gas may be provided to the processing chamber through a side entry 320 coupled to a side wall 360 of the chamber 302.

A feed system 328, including a chemical delivery system 310 and a metal precursor contact chamber 312, is coupled to the chamber 302 through a variety of conduits. A first conduit 322 and a second conduit 324 may couple the feed system 328 to the optional showerhead 304. The showerhead 304 may be a dual-pathway showerhead to prevent mixing of the precursors prior to entry into the chamber 302. An exemplary dual-pathway showerhead is described in commonly assigned U.S. Pat. No. 6,983,892, entitled "Gas distribution showerhead for semiconductor processing", issued Jan. 10, 2006.

Alternately, or additionally, cross-flow gas injection may be practiced by providing first and second cross-flow gas conduits 316 and 318 to the side entry point 320. An example of a cross-flow injection configuration is described in U.S. Pat. No. 6,500,734. The apparatus 300 may contain both a showerhead configuration and a cross-flow injection configuration, or only one or the other configuration.

The chemical delivery system 310 delivers Group III or Group V precursors, optionally with carrier gases such as nitrogen ($N_2$) and/or hydrogen ($H_2$), to the chamber 302. The chemical delivery system 310 may also deliver deposition or selectivity control species to the chamber 302. The chemical delivery system 310 may include liquid or gaseous sources and controls (not shown), which may be configured in a gas panel.

A contact chamber 312 may be coupled to either the side entry point 320 or the showerhead 304 by a conduit 314 disposed to carry a metal precursor to the chamber 302. Conduits 314, 316, and 322 may be heated to a temperature between about 50° C. and about 200° C. to control or prevent condensation of the metal precursor therein. The contact chamber 312 typically contains a bed of solid metal or metal halide crystals. The metal halide crystals may be sublimed into a carrier gas provided through one or both of the gas feed conduits 362 and 364. The solid metal may be contacted with a halogen gas source provided through one or both of the gas feed conduits 362 and 364. In one embodiment, a halogen gas source is provided through a first gas feed conduit 362 while a carrier gas is provided through a second gas feed conduit 364. The gases, either for subliming or reacting, may be flowed through a powdered metal or metal halide fluidized bed to enhance contacting. A mesh strainer or filter may be used to prevent entrainment of particles into the chamber 302. Alternately, the gases may flow across a fixed solid metal or metal halide bed.

An exhaust system 330 is coupled to the chamber 302. The exhaust system 330 may be coupled to the chamber at any convenient location, which may depend on the location of the gas entry into the chamber. For gas entry through the showerhead 304, the exhaust system may be coupled to a bottom wall of the chamber, around the heat source 306, for example, by one or more portals or through an annular opening. An annular manifold may be disposed near an edge of the substrate support and coupled to the exhaust system 330 in some embodiments. For cross-flow embodiments, the exhaust system 330 may be coupled to a side wall of the chamber opposite the side entry point 320.

An exhaust conduit 340 couples an exhaust cap 332 to a vacuum pump 352 through a throttle valve 366. A jacket 368 encompasses the exhaust conduit 340 and throttle valve 366 from the exhaust cap 332 to an inlet 350 of the vacuum pump 352. The jacket 368 enables thermal control of the exhaust conduit 340 to prevent condensation of exhaust species in the line. Any heating medium, such as steam, or hot air, water, or other hot fluid, may be used to maintain the exhaust conduit at a temperature above a dew point of the exhaust gas. Alternately, the jacket may include resistive heating elements (e.g., an electric blanket). A condensation trap 336 may be coupled to the exhaust conduit 340 by a valve 338, if desired, to further enhance trapping of any condensates in the exhaust system 330. The vacuum pump 352 pays off to an abatement system 356 through an abatement conduit 354, which is typically not heated or jacketed, and cleaned gas exhausted at 358. To further reduce wetting or nucleation in the exhaust conduit 340, the exhaust conduit 340 may be coated with quartz or with an inert polymer material.

Plasma or ultraviolet activated cleaning agents may be coupled into the exhaust system 330 by active source 334, which may be coupled to a microwave or RF chamber for generating active cleaning species. A cleaning gas line 326 may provide cleaning gases from the chemical delivery system 310 to the exhaust conduit 340, proceeding through the active source 334, if desired. Use of active species for cleaning allows cleaning to proceed at reduced temperatures.

A method for cleaning a chamber used to perform the methods described herein, such as the chamber 302, may include providing a halogen gas to the chamber, converting residues to volatile halides. Temperature of the chamber is typically maintained below about 600° C. during cleaning, and metal deposits are converted to $MCl_x$. The halogen gas may be chlorine gas, fluorine gas, HCl, or HF. The chamber may be heated to an extent that separate heating of the exhaust conduit is not needed, especially if the exhaust conduit is insulated. Alternately, chamber temperature may be kept below about 400° C., if desired, and the exhaust conduit 340 heated to prevent condensation.

A controller 370 may be provided and coupled to various components of the apparatus 300 to control the operation thereof. The controller 370 includes a central processing unit (CPU) 372, a memory 374, and support circuits 376. The controller 370 may control the apparatus 300 directly, or via computers (or controllers) associated with particular process chamber and/or support system components. The controller 370 may be one of any form of general-purpose computer processor that can be used in an industrial setting for controlling various chambers and sub-processors. The memory, or computer readable medium, 374 of the controller 370 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 376 are coupled to the CPU 372 for supporting the processor in a conventional manner. These circuits include cache, power supplies, clock circuits, input/output circuitry and subsystems, and the like. Inventive methods as described herein may be stored in the memory 374 as software routine that may be executed or invoked to control the operation of the process chamber 300 in the manner described herein. The software routine may also be stored and/or executed by a second CPU (not shown) that is remotely located from the hardware being controlled by the CPU 372.

While the foregoing is directed to embodiments of the present invention, other and further embodiments of the invention may be devised without departing from the basic scope thereof.

The invention claimed is:

1. A method of depositing a group III-V layer on a substrate, comprising:
    etching a silicon-containing substrate, having a surface oriented in a direction other than a <111> direction, to etch out a source/drain region in the silicon-containing substrate;
    growing a silicon-containing surface oriented in the <111> direction in the etched out source/drain region atop a surface oriented in a direction other than the <111> direction;
    depositing a first layer comprising at least one of a first Group III element or a first Group V element on the silicon-containing surface oriented in the <111> direction at a first temperature ranging from about 300 to about 400 degrees Celsius; and
    depositing a second layer comprising a second Group III element and a second Group V element atop the first layer at a second temperature ranging from about 300 to about 600 degrees Celsius.

2. The method of claim 1, wherein the first Group III element is the same as the second Group III element.

3. The method of claim 1, wherein the first Group V element is the same as the second Group V element.

4. The method of claim 1, further comprising:
    etching the silicon-containing substrate having the surface oriented in the direction other than the <111> direction until another surface oriented in a direction other than the <111> direction is reached.

5. The method of claim 1, wherein the second layer further comprises at least one of a third Group III element or a third Group V element.

6. The method of claim 1, wherein the second layer comprises one of a binary or ternary Group III-V material.

7. The method of claim 1, wherein the first and second Group V elements comprises at least one of arsenides or phosphides.

8. The method of claim 1, further comprising:
    etching the second layer to selectively remove a portion of the second layer deposited on a second surface of a dielectric layer disposed adjacent to the silicon-containing surface.

9. The method of claim 8, wherein depositing the second layer and etching the second layer is performed simultaneously.

10. The method of claim 8, wherein the second layer is etched using an etchant comprising at least one of chlorine (Cl) or bromine (Br).

11. A computer readable medium having instructions stored thereon that, when executed, cause a method of depositing a group III-V layer on a substrate to be performed in one or more process chamber, the method comprising:
    etching a silicon-containing substrate, having a surface oriented in a direction other than a <111> direction, to etch out a source/drain region in the silicon-containing substrate;
    growing a silicon-containing surface oriented in the <111> direction in the etched out source/drain region atop a surface oriented in a direction other than the <111> direction;
    depositing a first layer comprising at least one of a first Group III element or a first Group V element on the silicon-containing surface oriented in the <111> direction at a first temperature ranging from about 300 to about 400 degrees Celsius; and depositing a second layer comprising a second Group III element and a second Group V element atop the first layer at a second temperature ranging from about 300 to about 600 degrees Celsius.

12. The computer readable medium of claim 11, further comprising:

etching the silicon-containing substrate having the surface oriented in the direction other than the <111> direction until another surface oriented in a direction other than the <111> direction is reached.

13. The computer readable medium of claim 11, wherein the second layer further comprises at least one of a third Group III element or a third Group V element.

14. The computer readable medium of claim 11, wherein the second layer comprises one of a binary or ternary Group III-V material.

15. The computer readable medium of claim 11, further comprising:

etching the second layer to selectively remove at portion of the second layer deposited on a second surface of a dielectric layer disposed adjacent to the silicon-containing surface.

16. The computer readable medium of claim 15, wherein depositing the second layer and etching the second layer is performed simultaneously.

17. The computer readable medium of claim 15, wherein the second layer is etched using an etchant comprising at least one of chlorine (Cl) or bromine (Br).

18. The computer readable medium of claim 11, wherein at least one of the first Group III element is the same as the second Group III element or the first Group V element is the same as the second Group V element.

\* \* \* \* \*